United States Patent [19]

Starewicz et al.

[11] Patent Number: 4,949,044
[45] Date of Patent: Aug. 14, 1990

[54] APPARATUS FOR MAPPING A STATIC MAGNETIC FIELD

[75] Inventors: Piotr M. Starewicz, Plainfield, N.J.; David F. Hillenbrand, Groveland, Mass.

[73] Assignee: Resonance Research, Inc., Billerica, Mass.

[21] Appl. No.: 364,310

[22] Filed: Jun. 9, 1989

[51] Int. Cl.[5] ............................................ G01R 33/20
[52] U.S. Cl. ...................................... 324/320; 324/318
[58] Field of Search ............... 324/300, 307, 309, 318, 324/319, 320, 322, 220, 219, 221

[56] References Cited

U.S. PATENT DOCUMENTS 4,710,710 12/1987 Flora et al. ......................... 324/220
4,851,773 7/1989 Rothstein ........................... 324/220
4,855,677 8/1989 Clark, Jr. et al. .................. 324/220

*Primary Examiner*—Michael J. Tokar
*Attorney, Agent, or Firm*—Paul J. Cook

[57] ABSTRACT

Apparatus for mapping a static magnetic field is provided. A liquid sample is positioned in a magnetic field probe adapted to generate an alternating magnetic field and for measuring an induced signal from the sample as a result of being exposed to the alternating magnetic field. The induced signal from the sample is measured at discrete points along a helical path located within the static magnetic field. Axial and radial shim coils can be positioned within the static magnetic field and the current directed to the coils can be controlled as a result of the field mapping results in order to homogenize the static magnetic field.

6 Claims, 7 Drawing Sheets

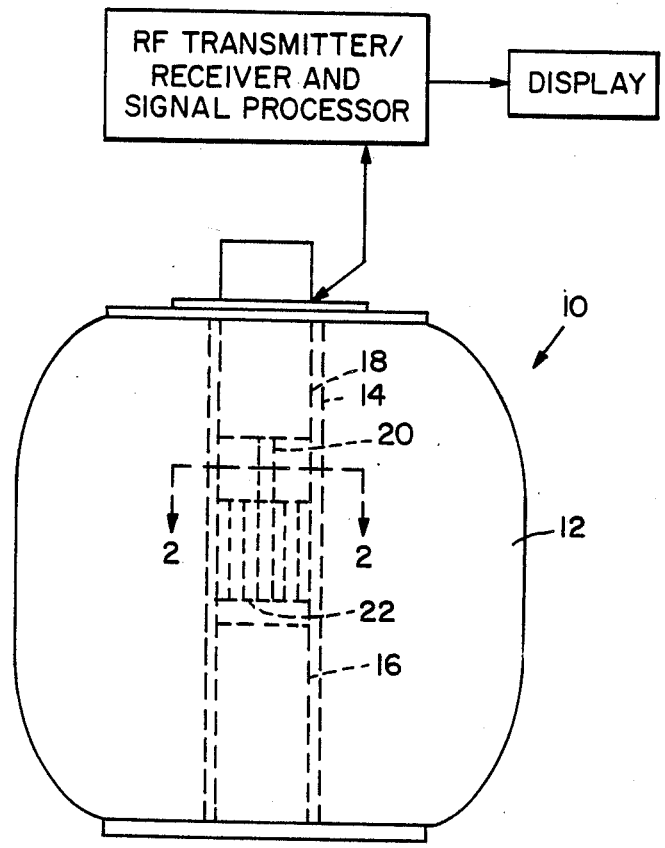
Fig. 1
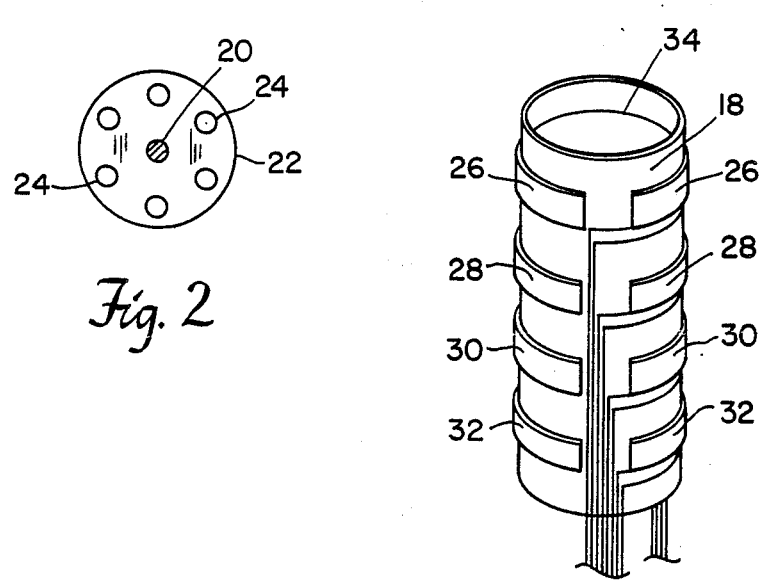
Fig. 2
Fig. 3

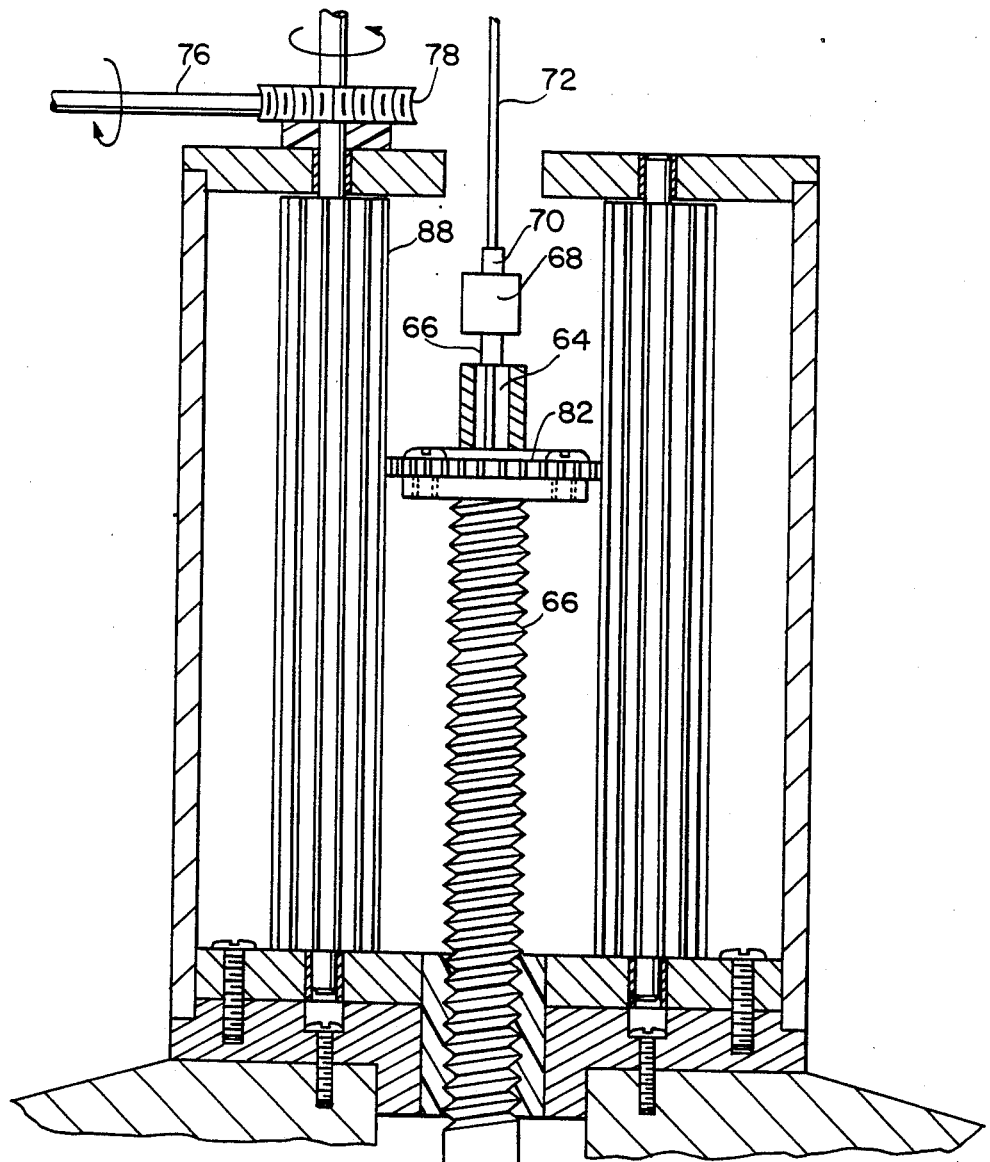
Fig. 6
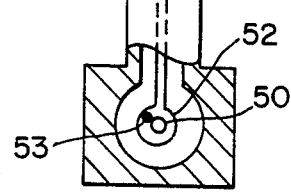
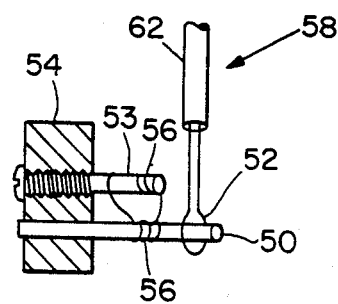
Fig. 6A

APPARATUS FOR MAPPING A STATIC MAGNETIC FIELD

This application is a continuation-in-part of copending application Ser. No. 182,953, filed Apr. 18, 1988, now U.S. Pat. No. 4,862,087.

BACKGROUND OF THE INVENTION

This invention relates to a method and apparatus for mapping magnetic fields such as in superconductive and solenoid magnets either alone or in conjunction with gradient coil assemblies associated with such magnets.

Nuclear magnetic resonance (NMR) is the resonance effect of an alternating magnetic field at right angles to a static magnetic field to change the orientation of nuclear magnetic polarization moments within a sample within the static magnetic field. The alternating magnetic field generally is applied as the magnetic component of a radio frequency field which can be applied in a continuous manner over a frequency range or which can be applied as pulses at a fixed frequency. The applied magnetic field causes an induced signal from the sample which signal is uniquely characteristic for a given nucleus and magnetic field strength. In order for the measured induced nuclear magnetism to accurately reflect the characteristic of the nuclear sample, it is essential that the static magnetic field be homogeneous over the sample volume.

The use of currents in coils of varying geometry to establish magnetic field uniformly (homogeneity) is an established practice. Such practice has resulted in design and utilization of space efficient coils for simultaneous control of various axial gradients of the magnetic field in which each coil addresses more than one axial gradient of the field. Conventional practice of design and utilization of coils for control of radial gradients of the magnetic field have extended to gradients of relatively lower order and typically uses designs in which each coil assembly is used for only one radial gradient of the magnetic field; a spatially inefficient approach if a relatively large number of gradients are to be controlled.

At the present time mapping of the magnetic field in a solenoidal geometry such as in NMR apparatus is conducted either by mechanical movement or NMR imaging. In mechanical movement, an NMR probe containing a sample which is small in comparison to the rate of variation of the field over the sample volume but large enough to afford sensible signal to noise, is moved mechanically through the volume of interest within the magnet. Typical trajectories of sample movement have been along the vertical axis of the void volume within the solenoid and about circles in planes perpendicular to the vertical axis of the solenoid. This method requires excess data in that two experiments are required which results in an excessive time to obtain the required data and is mechanically more complicated. Up to the present time utilizing mechanical movement have limited uses especially for high resolution, high field, narrow bore magnets due to the requirement of large probes, size, cumbersome manual operation, low precision of operation and lack of analytical capabilities. In addition, this mapping means requires an inordinate time period to effect the mapping and also requires a technician be present to record and access each reading.

A second presently utilized method is used in magnetic resonance imaging (MRI) based on pixel-by pixel observation of phase of the signal produced by a large uniform phantom. This technique has been found to be useful down to 0.1 ppm at the low fields used in imaging. In principle, similar techniques could be used in higher resolution, high field magnets. However, a large frequency distribution of the signal due to field variation over the volume of interest within the magnet renders this method applicable for fine tuning only. Interpretation ambiguities and instrumental complexities also render this method unattractive.

Therefore, it would be desirable to provide a means for mapping a magnetic field which eliminates the need for a skilled technician to be present and which is accurate over a large number of magnetic field gradients such as 20 or more.

SUMMARY OF THE INVENTION

In accordance with this invention, there is provided an apparatus for mapping a static magnetic field and an apparatus for homogenizing a static magnetic field over a large number of magnetic field gradients such as 20 or greater. An NMR sample is mounted on a magnetic field probe adapted to generate an alternating magnetic field and for measuring an induced signal from the sample. The sample is moved to discrete positions along a helical path with the static magnetic field so that gradients of the z-magnetic field can be measured over a desired volume. The measured gradients then can be utilized to determine current to be directed to radial and axial shim coils positioned within the static magnetic field in order to homogenize the static magnetic field over at least the first 6 orders of the spherical harmonic expansion of gradient of the static magnetic field. Means are provided for direct control of the current to the shim coils as a function of the induced signal measured. By utilizing the apparatus of this invention wherein measurements are taken along a helical path rather than an axial path or in a plurality of parallel radial paths, homogenization of a static magnetic field of at least the first 6 orders of the spherical harmonic expansion of gradient of the static magnetic field can be achieved.

BRIEF DESCRIPTION OF THE DRAWINGS

FIG. 1 is a block diagram of an NMR apparatus utilizing this invention.

FIG. 2 is a cross-sectional view of a sample holder of this invention taken along line 2—2 of FIG. 1.

FIG. 3 is a hollow cylinder of this invention for securing radial coils of this invention.

FIG. 6 is a cross-sectional view of the mapping apparatus of this invention.

FIG. 6A is a cross-sectional view of a probe-sample arrangement for use in the apparatus of FIG. 6.

FIG. 10 is a block diagram of a portion of a frequency synthesizer.

DESCRIPTION OF SPECIFIC EMBODIMENTS

Figure 4:
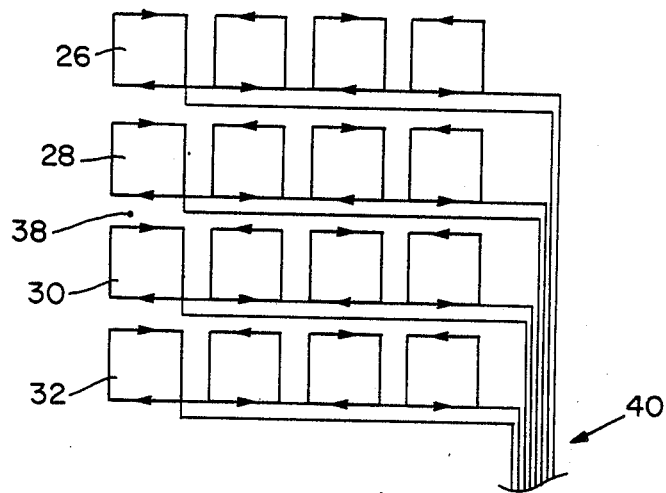
FIG. 4 is a schematic view of the radial coils shown in FIG. 3 to zero out magnetic gradients.

The present invention will be described specifically herein in terms of mapping a static magnetic field of an NMR apparatus. However, it is to be understood that this invention is useful in any apparatus utilizing a static magnetic field in which mapping of the magnetic field is desirable.

In the NMR apparatus, a relatively large volume of a homogeneous static magnetic field is provided by utilizing radial and axial coils positioned within a room temperature bore of a magnet.

The position and design of the coils which are connected to a controlled current source as a well as the current to be provided from the power supply during use is determined by the symmetries of the homogeneity terms to be controlled by an individual assembly and by utilizing a mathematical model to first calculate the field produced from a radial coil composed of those placed at particular radial phase angles and axial positions. The radial magnetic coils are composed of saddle shaped coils while the axial magnetic coils are circular components each formed from multiwinds of wire. Suitable field equations which are useful for designing the coils are obtainable from the Laplace or Poisson equations for an arc of wire placed at a given radius having a given arc length and a given height from the center of the static magnetic field. The field generated by the coil is calculated for each arc or circle coil and the contributions from the arcs or circles is summed to determine the magnetic field generated by the radial coils or axial coils. The magnetic field generated by the radial coils within the central volume of the static magnetic field can be determined from a sufficient number of gradients of the field at the center thereof by expanding the field such as utilizing a Taylor series or a spherical harmonic expansion. In this procedure, the terms of the expansion are equated order by order to determine the field gradients and the terms of the spherical harmonic expansion coefficients. The spherical harmonic expansion coefficients are set forth in Equation 1.

$$H_z = \sum_{m=1}^{\infty} \sum_{m=0}^{n} r^{n-1}[(n-m)\cos\theta\, P_n^m(\cos\theta) + \sin\theta\, P_n^{m+1}(\cos\theta)][A_n^m \cos m\phi + B_n^m \sin m\phi] \quad \text{Equation 1}$$

The spherical harmonic functions, $P_n^m$ and $P_n^{m+1}$ are expressed in terms of cosine $\theta$. The coefficients $A_n^m$ and $B_n^m$ express the amount of each spherical harmonic actually observed, r, $\theta$ and $\phi$ are cylindrical coordinates of the point at which the field is being sampled. $\theta$ is the angle in the x y plane and $\phi$ is the z angle. n and m are indices to which the spherical harmonic term is being referred. The Taylor expansion and the spherical harmonic expansion are equal to each other since both describe the field. Therefore, one can allow the gradients to be grouped according to each term of the spherical harmonic expansion.

After the radial and axial coils have been designed and placed on a cylinder, they are placed within the static magnetic field and the magnetic field resulting from the static magnetic field, and the radial and axial coils having current therethrough is mapped at a number of points to determine experimentally what the strength of each coefficient is of each term of the spherical harmonic expansion. Since the experimental coefficient is known and it is known which gradients relate to each term of the expansion, and the power from each coil has been calculated from the model for each gradient, one can determine the gradient in terms of field strength or flux density or power/ampere for each term from the model. Since one has the experimental results of the strength, one can determine the amperes required to each coil for each term of the spherical harmonic expansion. Therefore, one can calculate the current strength (ampere) needed to be supplied to each coil in order to effect cancellation of magnetic gradients in the static magnetic field.

In the present invention with an NMR apparatus, for example, mapping of the static magnetic field is effected by utilizing a radio frequency (RF) probe and a liquid sample which are inserted into the room temperature bore of the magnet to obtain magnetic field measurements at varying positions along a helical path within the magnetic field. The magnetic field measurements are both obtained at varying axial and radial heights and axial and radial positions within the bore on both sides of the theoretical zero point of the static magnetic field by making the measurements at discrete points along a helical path within the bore. Typically, measurements are taken at a radius extending from the axial center of the bore and at evenly spaced radial angles about the circumference of the bore, e.g., at 30° intervals at 0.7 to 1.5 cm from the axial center along the helical path surrounding the static magnetic field center. Generally, the pitch of the helix utilized in the apparatus of this invention is between 1 and 5 mm, per rotation, preferably between 1.5 and 2.5 mm per rotation, with respect to the vertical axis of the bore of the magnet. When utilixing higher pitches, the distance between discrete points is sufficiently small as to cause undesirable under-sampling. When the pitch is smaller, excessive amounts of data are generated.

In the process of this invention, mapping is effected by positioning an RF probe and a liquid sample within the bore of a magnet and securing the probe and sample to an apparatus which causes the probe and sample to move along a helical path within the bore. A motor such as a stepping motor or a pneumatic motor which permits movement of the probe and sample between discrete points along the helix is provided. The motor is controlled and monitored by a computer suitably programmed to cause the probe and sample to move between discrete points within a short time. Commensurate with the movement of the probe and sample, a computer driven frequency synthesizer is provided to generate a suitable radio frequency which is directed to the probe through a modulator/demodulator which functions to alternately direct power to the radio frequency probe or to prevent power from reaching the frequency probe so that the NMR measurements of the sample can be obtained. In addition, means are provided to effect the measurement of the induced signal from the sample at each discrete point, which signal is directed to the computer so as to correlate the induced signal with position of the sample within the magnet bore.

When mapping the static magnetic field while homogenizing the field, the above described process leads to a design comprising a plurality of sets of coils wherein each set comprises an even number of coils comprising at least two coils and wherein each set is designed to zero out a particular magnetic field gradient. Each coil design has at least one set of coils positioned above the zero point of the magnetic field and at least one set of coils below the zero point of the magnetic field. Mapping the open room temperature bore has advantages in that it utilizes a clear observable to determine a number of gradients and produces a set of current settings that is substantially independent of operator skill. This procedure establishes the field independently of the probe that will be used in experimental work subsequently so that when the subsequently utilized probe has non-zero susceptibility, small changes in the current setting must be introduced to compensate approximately for this non-zero susceptibility. However, this is not a problem since the advantage is that the field settings decouple the results from the probe and if a subsequently used probe provides anomalous values, the operator knows that the probe is anomalous and not the magnetic field.

The coils are wound separately rather than in series or are wound separately in sets wherein the coils of a set are distributed symmetrically within the static magnetic field. The product of current and turns in each coil is adjusted so that the current level can be generated within a reasonable dynamic range or the current source. The current to each coil can be varied by adjusting the voltage in the circuit. Alternatively, in a preferred embodiment, an amplifier which produces current digitally in conjunction with a standard digital to analog converter can be utilized to divide the current so that each coil set receives proper current to effect zeroing out of the magnetic field gradients.

The coils are wound or driven to produce asymmetric or symmetric coil pairs. Even z gradients can be made with a set of coils with paired symmetrically wound turns. Odd or even gradients can be produced with a set of coils if they are powered separately and the direction of current is controlled. Odd or even gradients can be produced when a set of coils is wound in pairs. When utilizing superconducting coils, the coils are arranged in parallel and one switch is utilized for more than one coil or timing several switches on and off at the same time for individual sets of loop elements. In practice the coils are wound on a cylinder which then is placed within the bore of the solenoid magnet generating the static magnetic field.

Referring to FIGS. 1 and 2, an NMR spectrometer 10 includes a high field superconducting magnet 12 having a bore 14 into which is positioned a cylinder 16 on which are mounted radial magnetic coils and axial coils. A probe 18 is positioned within bore 14 and is attached by means of cylinder 20 to a sample retainer 22. The sample retainer 22 includes a bore 24 into which an off axis sample can be fit. The mapping means will be more fully described with reference to FIG. 7.

Figure 5:
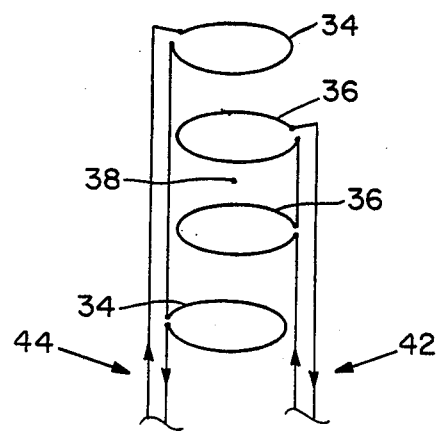
FIG. 5 is a schematic view of the axial coils of this invention to zero out magnetic gradients.

Referring to FIGS. 3, 4 and 5, the cylinder 18 has mounted thereon a plurality of rows of radial saddle shaped coils 26, 28, 30 and 32 which are connected to digital to analog (D/A) digitally controlled current driven converters (not shown). The D/A converter together with suitable microprocessing means serve to control the current in each coil in order to zero out orders of magnetic gradient of the magnetic field. The plurality of layers of radial coils are mounted on the outside surface of cylinder 18 by employing an insulating layer between adjacent layers of radial coils. The axial coils 34 and 36 (See FIG. 5) are mounted on the inside surface of cylinder 18 about static magnetic field center 38. The coils are provided with conventional current feeds 40, 42 and 44.

Referring to FIGS. 6 and 6A, a sample container 50 which houses a sample is secured to housing 54 which also contains a positioning screw 53. The positioning screw 53 is connected to sample housing 50 by means of coil 56. As the screw 53 is turned, sample housing 50 slides within housing 54 to position it relative to R.F. probe 52. The probe 52 is connected to coaxial cable 58 by means of a wire 60 and shield 62. The cable 58 extends through the bore 64 of screw 66. The cable 58 passes through SMA cable connector 68 and SMA cable convertor 70 so that the cable portion 72 does not rotate when screw 66 is turned. The cable 72 is connected to the electronic systems adapted to program the position of the probe and sample, to provide power to the probe and to measure the induced signal from the sample. The screw 66 is driven by a motor driven shaft 76, warm gear 78, orbital gear 80 and central gear 82. The rotation of the central gear 82 causes the screw 66 to rotate either clockwise or counterclockwise thereby to raise or lower the probe 52 and sample holder 50 along the helical path of the screw 66. By causing the sample and probe to move along the helical path to discrete positions, a family of measurements can be taken at varying radial positions and at varying heights within the bore thereby to provide a suitable map of the static magnetic field.

Figure 7:
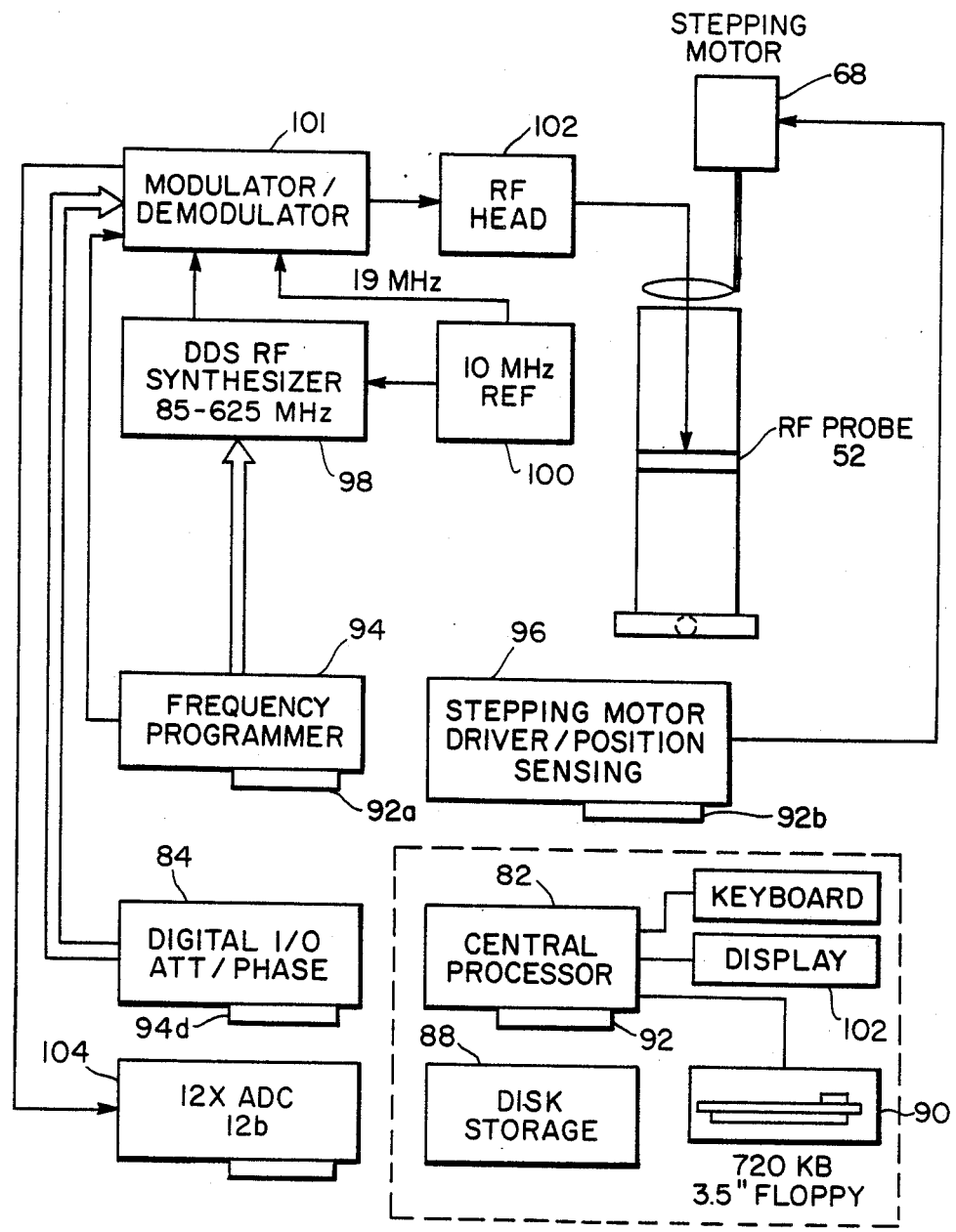
FIG. 7 is a block design of this invention.

FIG. 7 is a block diagram of the system for energizing and positioning the RF probe 52 for purposes of mapping the magnetic field. This control system is based upon a conventional computer system 80 that comprises a central processor 82, a keyboard 84 for certain input operations, a display 86 for output operations, a disk storage unit 88 and a floppy disk storage unit 90. The central processor unit 82 has a series of serial and parallel ports for transferring and receiving information from other elements in the system; these ports are represented by a box 92 appended to the central processor 82.

Control signals from the central processor 82 under program control are transferred to a frequency programmer 94 through corresponding port 92a and a stepping motor driver/position sensing unit 96 through a port 92b. The stepping motor also receives signals from the central processor 82 through ports 94d. This circuit controls the various signal paths and attenuation levels within the modulator/demodulator 101 in order to appropriately establish operating parameters during the modulation and demodulation phases of operation of the circuit 101. Sensing unit 96 establishes position of the RF probe 52 within the bore of the magnet by sending signals to the stepping motor 68 according to a predetermined pattern as described above. At each such position of the RF probe, the computer system 80 also transfers control signals to the frequency programmer 94 to control the frequency of the RF signal applied to the RF probe 52 and to establish operating conditions for transmitting a signal to the RF probe 52 and receiving a signal from the RF probe 52.

More specifically, frequency selection signals from the frequency programmer 94 control a direct digital synthesis RF frequency synthesizer 98 that receives a frequency reference signal from a master oscillator 100. The master oscillator 100 and the RF synthesizer 98 energize a modulator/demodulator circuit 101. These and signals from the frequency programmer establish an energizing frequency that is transmitted through an RF head 102 to the RF probe 52 thereby to produce an energizing pulse. When the modulator/demodulator 101 assumes a receiving mode, signals from the RF probe 52 transfer through the RF head 102 to the modulator/demodulator 101 whereupon they are demodulated into quadrature analog signals. A pair of analog-to-digital converters 104 separately convert the analog signals into digital format for transfer through port 92c to the computer system 80. This information is then accumulated in the computer system for appropriate output on the display 86.

Figure 8:
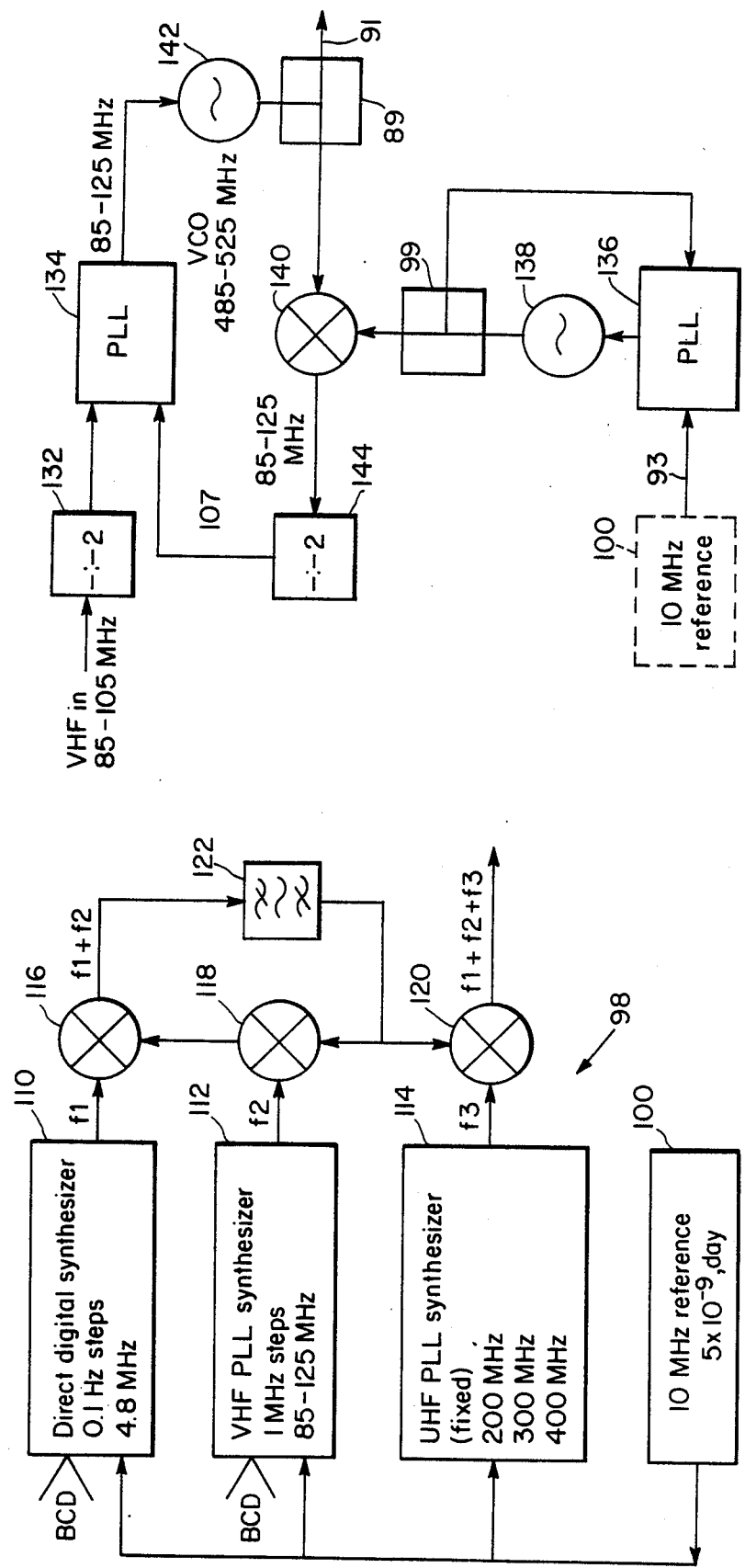
FIG. 8 is a block diagram useful in understanding the operation of the frequency synthesizer shown in FIG. 7.

The RF synthesizer 98 comprises three synthesizing components as shown in FIG. 8. These include a direct digital synthesizer 110, a VHF phase lock loop synthesizer 112 and a UHF phase lock loop synthesizer 114. The synthesizer 98 receives a clock signal from the clock reference 100 that controls and synchronizes the operations of each of the synthesizers 110, 112, and 114. In addition control signals from the frequency programmer 94 are applied in binary coded decimal form to the synthesizers 110 and 112. The synthesizer 110 is a direct digital signal synthesizer that increments in steps over a limited range. In one example the synthesizer range is 4 to 8 MHz with a step of 0.1 Hz to thereby provide a gradual shift from 4–8 MHz. The output from the synthesizer 110 is fed into a summing circuit 116.

The VHF phase lock loop synthesizer 112 produces a second set of RF signals that change over a range in discrete steps. Again in accordance with one specific example the synthesizer 112 produces signals having output frequencies in the range from 85 to 125 MHz in 4 MHz steps. The output from the synthesizer 112 is an output to a summing circuit 118.

A UHF phase lock loop synthesizer 114 is constructed to produce a set of output signals of selected frequencies, and these are applied to a summing circuit 120.

A filter 122 connected to the output of the summing circuit 116 passes the sum of the frequencies from the synthesizers 110 and 112 to the summing circuit 118 and to the summing circuit 120. The output signal from the summing circuit 118 is then coupled as an input signal to the summing circuit 116. The filter 122 also provides an input signal to the summing circuit 120 that produces an output signal at a frequency that is the sum of the frequencies from the three synthesizers 110, 112 and 114.

Figure 9:
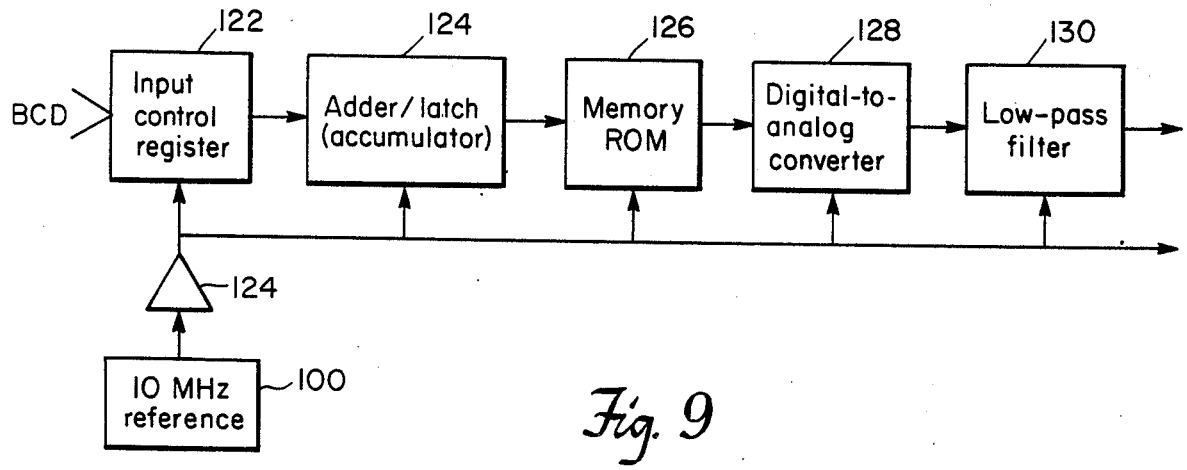
FIG. 9 is a block diagram useful in understanding components of the block diagram shown in FIG. 8.

The synthesizer 110 has a similar configuration as shown in FIG. 9. The corresponding binary coded decimal signals are clocked into an input control register 122 by the clocking signal from the reference, again shown in as a dashed box 100, a buffer 124 being interposed between the reference 100 and the various components of the circuits shown in FIG. 9. Typically, the initial frequency signal will be passed from the input control registers 122 to an accumulator 124 and thereafter each successive step will increment the contents of the accumulator 124. The output from the accumulator serves as an address to a memory system 126 that produces an appropriate output for a digital-analog converter 128 with a resultant analog signal being transferred through a low pass filter 130 thereby to serve as the output signal from the synthesizer.

The phase lock loop synthesizer 114 shown in FIG. 8 is shown in detail in FIG. 10. In accordance with this particular device, an output signal from the synthesizer 112 in FIG. 8 passes through a frequency divider 132 as one input to a phase lock loop 134. The clocking signal from the reference 100, again shown as a dashed box 100, is applied to another phase lock loop to control a voltage controlled oscillator 138. This oscillator output is then fed back to the phase lock loop 136 and transfers to a summing circuit (double balanced mixer) 140.

The output signal from the phase lock loop 134 controls a voltage controlled oscillator 142 that produces the f3 signal that is directed to the summing circuit 120 in FIG. 8 and that is coupled back to the summing circuit 140. The output signal from the summing circuit 140, which is the sum of the two signals, passes through another frequency divider 144 to serve as a second input to the phase lock loop 134.

From the foregoing discussion, it will be obvious that the signal coming from the RF synthesizer 98 in FIG. 7 to the modulator/demodulator 101 sweeps through a wide range of frequencies to produce a phase continuous adjustment of sweep rate. Moreover, the remaining controls shown in FIG. 7 allow the sweep rate to be adjusted in rate and width. The computer system 80 allows a fast wide sweep for peak localization and then slower narrower sweeps for resonance detection and peak picking. It also allows continuous resonance observation during magnetic ramp and overcycle conditions as well as during continuous probe movement. In one embodiment, the frequency synthesizer of FIG. 7 allows user selectable bands in the 100–600 MHz range with each band having a frequency range of 40 MHz. Phase continuous sweeps of 4 MHz are possible with a resolution of 0.1 Hz and a sweeping rate of up to 100 kHz per second.

These signals are then applied to a modulator and a base band quadrature detection demodulator 101 shown in FIG. 7. More details of this circuit are shown in FIG. 11 where two signals are combined, namely a 19 MHz clocking signal from the reference 100 shown in FIG. 7 and the RF signal from the RF synthesizer 98, both being shown by dash boxes in FIG. 11.

Figure 11:
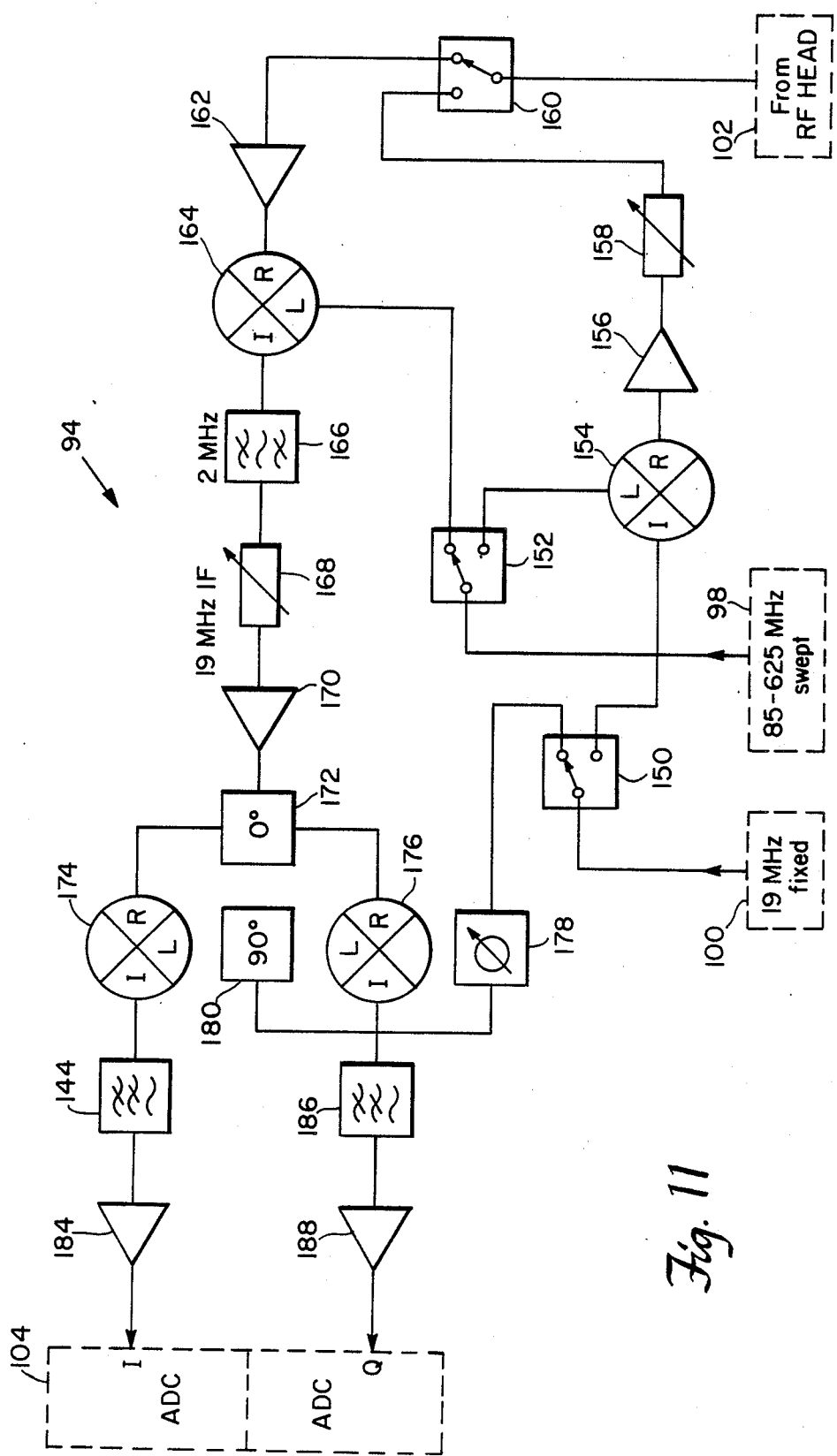
FIG. 11 is a circuit diagram of the modulator/demodulator circuit shown in FIG. 7.

In FIG. 11 switching circuits are shown in the "receive" position. During transmissions each of these switches is shifted to the normal opened position. Moreover, a number of attenuators and other variable components are shown. The digital input/output attenuation/phase circuit 84 shown in FIG. 7 controls the settings of these components, as is well known in the art.

Referring again to the circuit of FIG. 11, during transmission, the 19 MHz and RF frequency signals are applied through switches 150 and 152 to a modulating circuit 154. An amplifier 156, an attenuator 158 and another switch 160 convey the modulated signal to the RF head 102 shown by a dashed box 102. Thus, the RF frequency from the synthesizer 98 is mixed with the 19 MHz fixed frequency from the reference 100. The computer control assures that this modulation occurs in a short pulse and then the system terminates to return the switches 150, 152 and 160 to the condition shown in FIG. 11.

After transmission, induced energy can be detected so the probe 52 produces input signal. These signals from the RF probe 52 in FIG. 7 are amplified in the RF head 102 and returned to a two-stage demodulator through an input amplifier 162. A first demodulating stage 164 beats the sweep frequency against the incoming signal. The resulting intermediate frequency (if) signal passes through a band pass filter 166, an attenuator 168 and an amplifier 170. A 0° phase splitter 172 transfers this signal to a quadrature demodulator comprising a first demodulating section 174 and a second demodulating section 176.

The 19 MHz fixed frequency signal from the reference 100 passes through a phase shifter 178 to be applied as demodulating reference signals after passing through a 90° phase shifter 180. The demodulated signal from the modulating section 174 passes through a band pass filter 144 and an amplifier 184 to be conveyed back to one of the analog-to-digital converters shown in the dashed box 104. The other signal from the demodulating section 176 passes through a band pass filter 186 and an amplifier 188 to be transferred to the other analog-to-digital converter in the circuit 104. The resulting digital signals are a measure of the frequency at which the peak appears, which in turn is a reflection of the field strength at that position due to the combination of the fields produced by the static magnetic field plus those due to the shim coils and their currents.

Figure 12:
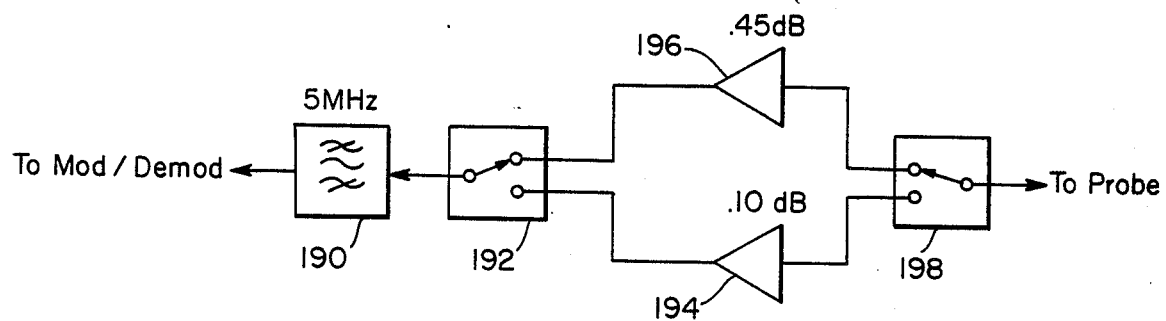
FIG. 12 is a block diagram the radio frequency head shown in FIG. 7.

FIG. 12 depicts the RF head shown in FIG. 7. This comprises a band pass filter 190, a switch 192, a transmitting amplifier 194, a receiving amplifier 196 and an output switching circuit 198. During transmission the switches 192 and 198 shift to the normally opened position so the modulated signal is transmitted through the band pass filter 190 and the amplifier 194. The amplifier 194 has a first gain that matches the power of the signal modulation to the power required for the probe. In the receive mode the switches 192 and 198 are positioned as shown in FIG. 12 so the incoming signal is amplified in the amplifier 196 before passing through and the band pass filter 190 to the circuit 101 in FIG. 7. The gain of the amplifier 196 is higher than the gain of the amplifier 194.

We claim:

1. Apparatus for mapping a static magnetic field generated by a static magnet which comprises:
    a liquid sample mounted on a magnetic field probe adapted to generate an alternating magnetic field and for measuring an induced signal from said sample, said signal being generated by said alternating magnetic field,
    means for generating said alternating magnetic field,
    means for moving said sample to discrete locations along a helical path within said static magnetic field, and
    means for recording said induced signal from said discrete locations.

2. The apparatus of claim 1 including means for rendering said static magnetic field substantially homogeneous, said means comprising a cylinder having mounted thereon a plurality of electrically conducting coils designed to zero out at least the first six orders of the spherical harmonic expansion of gradient of said static magnetic field.

3. Apparatus for homogenizing a static magnetic field generated by a static magnet which comprises:
    a liquid sample mounted on a magnetic field probe adapted to generate an alternating magnetic field and for measuring an induced signal from said sample, said induced signal being generated by said alternating magnetic field,
    means for generating said alternating magnetic field,
    a cylinder positioned within said static magnetic field having mounted thereon a plurality of electrically conducting coils designed to zero out at least the first 6 orders of the spherical harmonic expansion of gradient of said static magnetic field,
    means for moving said sample to discrete locations along a helical path within said static magnetic field, and
    means for supplying current to said coils to zero out said gradients in response to said induced signal.

4. The apparatus of claim 1 wherein said helical path has a pitch of between about 1 and 5 mm per rotation.

5. The apparatus of claim 2 wherein said helical path has a pitch of between about 1 and 5 mm per rotation.

6. The apparatus of claim 3 wherein said helical path has a pitch of between about 1 and 5 mm per rotation.

* * * * *